(12) United States Patent
Sato

(10) Patent No.: US 7,452,823 B2
(45) Date of Patent: Nov. 18, 2008

(54) ETCHING METHOD AND APPARATUS

(75) Inventor: Manabu Sato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 194 days.

(21) Appl. No.: 11/368,421

(22) Filed: Mar. 7, 2006

(65) Prior Publication Data

US 2006/0205216 A1 Sep. 14, 2006

Related U.S. Application Data

(60) Provisional application No. 60/665,359, filed on Mar. 28, 2005.

(30) Foreign Application Priority Data

Mar. 8, 2005 (JP) ............................. 2005-064372

(51) Int. Cl.
*H01L 21/302* (2006.01)
(52) U.S. Cl. ............... 438/706; 438/724; 257/E21.218; 257/E21.222
(58) Field of Classification Search ................. 438/706, 438/724; 257/E21.218, E21.222
See application file for complete search history.

(56) References Cited

U.S. PATENT DOCUMENTS

| 6,284,664 B1 * | 9/2001 | Kawai ......................... 438/710 |
| 6,838,381 B2 * | 1/2005 | Hsu et al. .................... 438/682 |
| 6,872,322 B1 * | 3/2005 | Chow et al. ................... 216/67 |

* cited by examiner

*Primary Examiner*—Scott B. Geyer
*Assistant Examiner*—Stanetta D Isaac
(74) *Attorney, Agent, or Firm*—Oblon, Spivak, McClelland, Maier & Neustadt, P.C.

(57) ABSTRACT

An etching method, for selectively etching a silicon nitride film to a silicon oxide film by using a processing gas in a processing chamber including an electrode therein, includes the steps of mounting a target object having the silicon oxide film and the silicon nitride film onto the electrode and etching the silicon nitride film by introducing a gaseous mixture containing $CF_4$ gas, $H_2$ gas and $N_2$ gas as a processing gas into the processing chamber and applying a high frequency power of 0.20 $W/cm^2$ or less to the electrode while maintaining a pressure in the processing chamber to be equal to or smaller than 4 Pa.

4 Claims, 6 Drawing Sheets

| | HIGH FREQUENCY POWER APPLIED TO SUSCEPTOR | SELECTIVITY E ($Si_3N_4/SiO_2$) |
|---|---|---|
| EXPERIMENT a | 200W | 2.67 |
| | 150W | 2.99 |
| EXPERIMENT b | 200W | 2.40 |
| | 150W | 2.61 |

6.67Pa(50mTorr)

(labels: DEPOSITS, BOWING)

4.0Pa(30mTorr)

2.67Pa(20mTorr)

| | MIXING RATIO OF $CF_4/H_2$ | SELECTIVITY E ($Si_3N_4/SiO_2$) |
|---|---|---|
| EXPERIMENT c | 3.1 | 2.61 |
| | 4.4 | 2.99 |
| EXPERIMENT d | 3.1 | 2.45 |
| | 4.4 | 2.67 |

ETCHING METHOD AND APPARATUS

CROSS-REFERENCE TO RELATED APPLICATIONS:

This document claims priority to Japanese Patent Application Number 2005-64372, filed Mar. 8, 2005 and U.S. Provisional Application No. 60/665,359, filed Mar. 28, 2005, the entire content of which are hereby incorporated by reference.

FIELD OF THE INVENTION

The present invention relates to etching method and apparatus for selectively etching a silicon nitride film to a silicon oxide film.

BACKGROUND OF THE INVENTION

In a manufacturing process of a semiconductor device such as IC or LSI, for example, when a contact hole is formed, an etching is performed on a silicon nitride film (SiNx film) through a mask of a silicon oxide film (SiO$_2$ film).

Generally, such an etching is performed in a plasma etching apparatus. In the plasma etching apparatus, for example, in a processing chamber, after a substrate including a silicon oxide film and a silicon nitride film formed on top thereof is mounted on a lower electrode, high frequency powers are applied to an upper electrode and the lower electrode and a processing gas is introduced into the processing chamber to generate a plasma. The silicon nitride film is etched by the plasma action.

Conventionally, when etching the silicon nitride film, a gaseous mixture containing CHF$_3$ gas, O$_2$ gas and Ar gas has been used as a processing gas. However, in case of using the gaseous mixture, a selectivity of the silicon nitride film to the silicon oxide film (an etching rate of the silicon nitride film/an etching rate of the silicon oxide film) is low, the ratio being approximately 2.0.

Therefore, in order to increase the selectivity of the silicon nitride film to the silicon oxide film, there has been proposed a technique of using a gaseous mixture containing CH$_2$F$_2$ gas, O$_2$ gas and Ar gas as a processing gas (see, e.g., Reference 1).

[Reference 1] Domestic Re-Publication of PCT patent application WO 98/16950

However, in case of using the gaseous mixture containing CH$_2$F$_2$ gas, O$_2$ gas and Ar gas, although the selectivity increases, there may occur a bowing phenomenon, wherein sidewalls of grooves on the silicon nitride film are etched to be concaved, or reaction products may become attached to the sidewalls of the grooves to form deposits thereon, causing the silicon nitride film to be etched into an improper shape. If the silicon nitride film is etched into an improper shape, for example, a fine contact hole having a high dimensional accuracy may not form, which, in turn, will likely make it difficult to form high performance semiconductor devices.

SUMMARY OF THE INVENTION

The present invention has been conceived from the above drawbacks of the conventional technique; and it is, therefore, an object of the present invention to provide etching method and apparatus, when a silicon nitride film is selectively etched to a silicon oxide film in a target object such as a wafer, capable of etching the silicon nitride film into a favorable shape while securing a high selectivity of the silicon nitride film to a silicon oxide film.

To achieve the object of the present invention, there is provided an etching method for selectively etching a silicon nitride film to a silicon oxide film by using a processing gas in a processing chamber including an electrode therein, the method including the steps of mounting a target object having the silicon oxide film and the silicon nitride film onto the electrode; and etching the silicon nitride film by introducing a gaseous mixture containing CF$_4$ gas, H$_2$ gas and N$_2$ gas as a processing gas into the processing chamber and applying a high frequency power of 0.20 W/cm$^2$ or less to the electrode while maintaining a pressure in the processing chamber to be equal to or smaller than 4 Pa.

In accordance with the etching method of the present invention, the silicon nitride film can be etched into a favorable shape while maintaining a high selectivity of the silicon nitride film to the silicon oxide film.

In the etching method, the processing gas may be introduced into the processing chamber while a volumetric ratio of the CF$_4$ gas to the H$_2$ gas is 3.1~4.4%.

In the etching method, the silicon nitride film may be etched by using the silicon oxide film as a mask while an underlying film thereof is a nickel silicide film. Further, the silicon nitride film may be etched by applying a high frequency power to another electrode disposed to face the electrode.

In accordance with another aspect of the present invention, there is provided an etching apparatus for selectively etching a silicon nitride film of a target object including a silicon oxide film and the silicon nitride film, the apparatus including a processing chamber in which an etching is performed; an electrode on which the target object is mounted in the processing chamber; a high frequency power supply for applying a high frequency power to the electrode; a processing gas introduction unit for introducing a processing gas which is a gaseous mixture containing CF$_4$ gas, H$_2$ gas and N$_2$ gas into the processing chamber; a pressure control unit for controlling a pressure in the processing chamber; and a controller for allowing the etching to be performed on the silicon nitride film under the condition that the processing gas is introduced into the processing chamber and a high frequency power of 0.20 W/cm$^2$ or less is applied to the electrode while maintaining a pressure in the processing chamber to be equal to or smaller than 4 Pa.

In accordance with the etching apparatus of the present invention, the silicon nitride film can be etched into a favorable shape while maintaining a high selectivity of the silicon nitride film to the silicon oxide film.

The controller may control the processing gas to be introduced into the processing chamber at a volumetric ratio of the CF$_4$ gas to the H$_2$ gas ranging from 3.1% to 4.4%.

The target object may use the silicon oxide film as a mask and have an underlying film of a nickel silicide film. Further, another electrode to which a high frequency power is applied may be disposed to face the electrode in the processing chamber.

In accordance with the present invention, the silicon nitride film can be etched into a favorable shape while maintaining a high selectivity of the silicon nitride film to the silicon oxide film during the manufacture of e.g. a semiconductor device, which will, in turn, result in improving the device performance.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
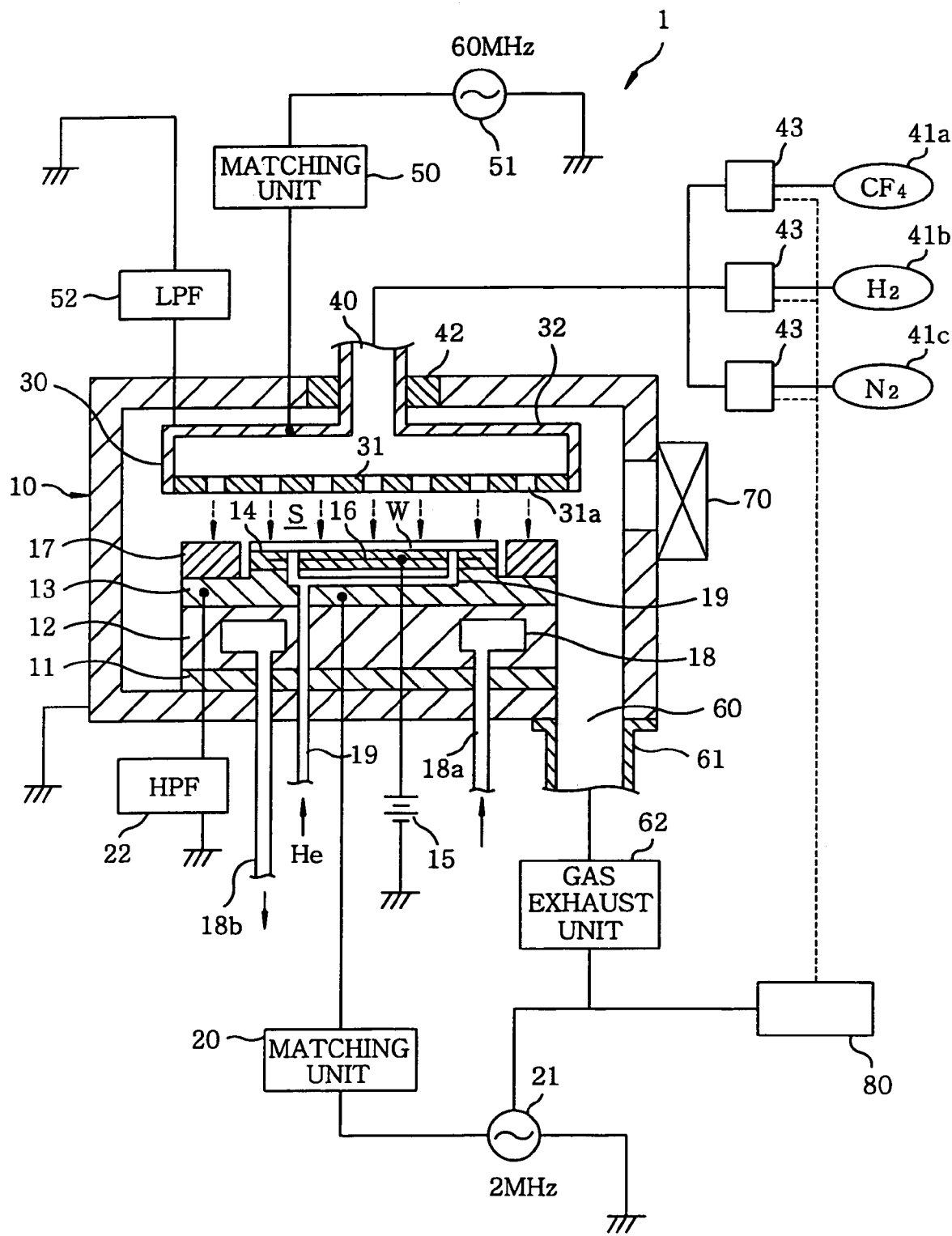
FIG. 1 schematically depicts a longitudinal sectional view showing a configuration of a processing etching apparatus in accordance with a preferred embodiment of the present invention.

Hereinafter, a preferred embodiment of the present invention will be described. FIG. 1 is a longitudinal sectional view showing a schematic configuration of a parallel plate type plasma etching apparatus 1 for performing an etching process in accordance with the preferred embodiment of the present invention.

The plasma etching apparatus 1 includes, for example, an approximately cylindrical processing chamber 10 in which a processing space S is formed. The processing chamber 10 is formed of, e.g., aluminum alloy and the inner wall surface thereof is covered with an alumina film or an yttrium oxide film. The processing chamber 10 is grounded.

A cylindrical susceptor supporting table 12 is disposed in a central bottom portion of the processing chamber 10 via an insulating plate 11. A susceptor 13 for mounting a wafer W thereon is disposed on the susceptor supporting table 12. The susceptor 13 also serves as a lower electrode. The susceptor 13 has a circular plate shape with a central top surface portion protruded, and is formed of, e.g., aluminum alloy.

An electrostatic chuck 14 for holding the wafer W is disposed on the susceptor 13, and the electrostatic chuck 14 has therein an electrode layer 16 connected to a DC power supply 15. The wafer W is placed on the top surface of the susceptor 13 and attached thereto by Coulomb force generated by a DC voltage applied to the electrode layer 16 from the DC power supply 15. Further, in this embodiment, the top surface of the susceptor 13 is formed in a circular shape having a larger diameter, e.g., 360 mm, than the wafer W having a diameter of 300 mm.

An annular focus ring 17 is disposed in a peripheral portion on the susceptor 13 to surround the wafer W mounted on the electrostatic chuck 14. The focus ring 17 is formed of, e.g., a conductive material. Further, the focus ring 17 may be formed of an insulating material such as ceramic or quartz.

An annular coolant chamber 18 is formed inside the susceptor supporting table 12. The coolant chamber 18 communicates with a chiller unit (not shown) installed outside the processing chamber 10 via lines 18a and 18b. A coolant or cooling water is supplied into the coolant chamber 18 through the lines 18a and 18b to be circulated therein, thereby controlling the temperature of the wafer W on the susceptor 13.

A gas supply line 19 passing through the susceptor 13 and the susceptor supporting table 12 reaches a top surface of the electrostatic chuck 14, whereby a thermally conductive gas such as He gas can be supplied between the wafer W and the electrostatic chuck 14.

A first high frequency power supply 21 is electrically connected to the susceptor 13 via a matching unit 20. The first high frequency power supply 21 can output a high frequency power having, for example, a frequency ranging from 2 to 20 MHz, making it possible to produce a bias voltage for attracting ions in the plasma of the processing gas. In the present invention, a frequency of 2 MHz is applied to the susceptor 13.

Electrically connected to the susceptor 13 is a high pass filter 22 for passing a high frequency wave to ground, and the high frequency wave is generated from a second high frequency power supply 51 at the side of an upper electrode 30 to be described later.

The upper electrode 30 is disposed above the susceptor 13 to face it in parallel. A plasma generation space is formed between the susceptor 13 and the upper electrode 30.

The upper electrode 30 functions as a shower head for injecting the processing gas toward the wafer W mounted on the susceptor 13. The upper electrode 30 includes, for example, an electrode plate 31 facing the susceptor 13 and an electrode supporting member 32 for supporting the electrode plate 31. The electrode supporting member 32 has an approximately hollow cylindrical shape, wherein the electrode plate 31 is provided to form a bottom surface. The electrode plate 31 has a plurality of gas injection holes 31a and the processing gas introduced into the electrode supporting member 32 can be discharged therethrough. Further, in this embodiment, the bottom surface of the upper electrode 30 is formed in a circular shape having a diameter of, e.g., 376 mm.

A gas feeding pipe 40 is connected to a central portion on a top surface of the electrode supporting member 32 of the upper electrode 30. The gas feeding pipe 40 passing through a top surface of the processing chamber 10 is divided into branch lines connected to, for example, three gas supply sources 41a, 41b and 41c. An insulating member 42 is interposed in a contact portion between the gas feeding pipe 40 and the processing chamber 10.

In this embodiment, the gas supply sources 41a, 41b and 41c are sealed to contain $CF_4$ gas, $H_2$ gas and $N_2$ gas, respectively. Mass flow controllers 43 are provided in branch lines of the gas feeding pipe 40, respectively, communicating with the gas supply sources 41a to 41c. Accordingly, gases from the gas supply sources 41a to 41c are mixed at a specified mixing ratio to be supplied into the processing space S. Further, a flow rate control in each of the mass flow controllers 43 is executed by an apparatus controller 80 to be described later. Moreover, in this embodiment, a processing gas introduction unit includes the gas feeding pipe 40, the gas supply sources 41a to 41c and the mass flow controllers 43.

A second high frequency power supply 51 is electrically connected to the upper electrode 30 via a matching unit 50. The second high frequency power supply 51 can output a high frequency power having a frequency equal to or greater than, e.g., 40 MHz, making it possible to produce a plasma of the processing gas. In the present embodiment, a frequency of 60 MHz is applied to the upper electrode 30.

Electrically connected to the upper electrode 30 is a low pass filter 52 for passing a high frequency wave to ground, and the high frequency wave is generated from the first high frequency power supply 21 at the side of the susceptor 13.

A gas exhaust port 60 is formed in a bottom portion of the processing chamber 10. The gas exhaust port 60 is connected to the gas exhaust unit 62, serving as a pressure control unit, including a vacuum pump and the like via a gas exhaust pipe 61. The processing chamber 10 can be depressurized to a desired pressure by using the gas exhaust unit 62.

The gate valve 70 is disposed at a sidewall of the processing chamber 10. The wafer W can be loaded into or unloaded from the processing chamber 10 by opening the gate valve 70.

The plasma etching apparatus 1 includes the apparatus controller 80 for controlling operations of various components to perform an etching under a specified processing condition. For instance, the apparatus controller 80 can control high frequency powers to be applied to the susceptor 13 and the upper electrode 30 by controlling outputs of the high frequency power supplies 21 and 51. The apparatus controller 80 can control a flow rate and a mixing ratio of the processing gas to be supplied into the processing space S by controlling a flow rate setting of the mass flow controller 43. In addition, the apparatus controller 80 can control the pressure in the processing space S by controlling the output of the gas exhaust unit 62.

Figure 2:
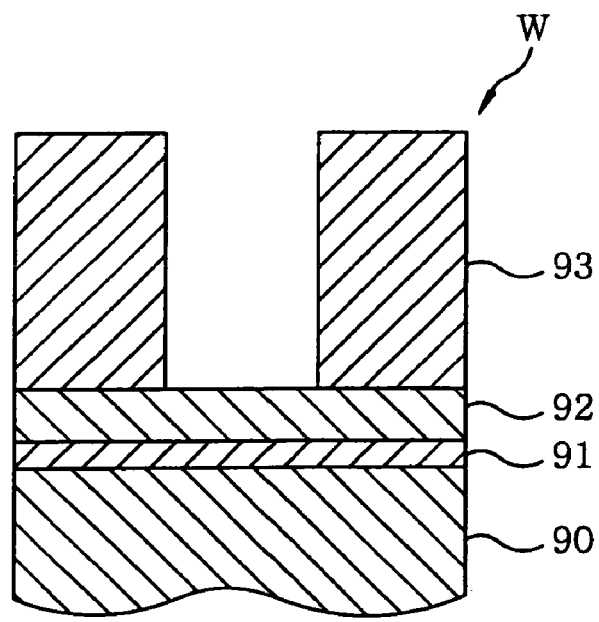
FIG. 2 illustrates a film structure of a wafer to be etched in accordance with the preferred embodiment.

Next, there will be described an example of a film layer structure of the wafer W to be etched by the plasma etching apparatus 1. FIG. 2 is a longitudinal sectional view showing the film layer structure of the wafer W.

As shown in FIG. 2, the wafer W includes a metal film 91, i.e., a nickel silicide film, formed of NiSi, a silicon nitride film 92 formed of $Si_3N_4$, and a silicon oxide film 93 formed of $SiO_2$, in order from the bottom, on the silicon substrate 90. The silicon oxide film 93 is patterned using a photolithography process. This film structure is used, for example, when the silicon nitride film 92 is etched into a trench (groove) shape through a mask of the silicon oxide film 93 to form a contact hole communicating with an underlying film, i.e., the nickel silicide film 91, in a manufacturing process of a transistor.

Next, there will be described a process for etching the silicon nitride film 92 on the wafer W by using the plasma etching apparatus 1. Further, the following example explains a case of processing the wafer W having a diameter of 300 mm.

Figure 3:
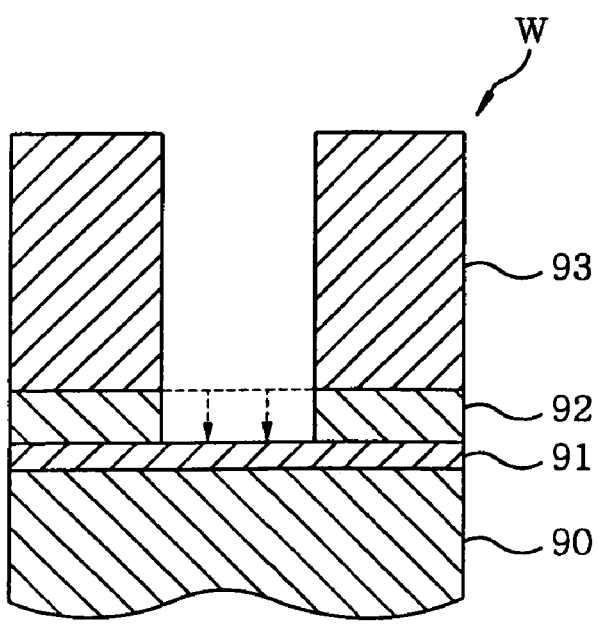
FIG. 3 shows a longitudinal sectional view of the wafer.

First, the wafer W is loaded into the processing chamber 10 and adsorbed on the susceptor 13. Then, the processing space S is exhausted by the gas exhaust unit 62 and the pressure in the processing space S is depressurized to 4.0 Pa (30 mTorr) or less. A gaseous mixture containing $CF_4$ gas, $H_2$ gas and $N_2$ gas is introduced into the processing space S from the upper electrode 30 to serve as a processing gas. The gaseous mixture introduced is such that a volumetric ratio of $CF_4$ gas to $H_2$ gas is 3.1~4.4%. Further, a flow rate of $N_2$ gas is controlled such that a ratio of a volume of $N_2$ gas to a total volume of $N_2$ gas and $H_2$ gas is smaller than 10%, that is, $N_2$ gas/($N_2$ gas+$H_2$ gas)<0.1. A specified high frequency power is applied to the upper electrode 30 from the second high frequency power supply 51, and a bias high frequency power equal to or smaller than 200 W is applied to the susceptor 13 from the first high frequency power supply 21. That is, a high frequency power equal to or smaller than 0.20 W/cm$^2$ is applied to the top surface of the susceptor 13 having a diameter of 360 mm. Accordingly, a reactive plasma from the processing gas is produced in the processing space S. As shown in FIG. 3, the silicon nitride film 92 is selectively etched through a mask of the silicon oxide film 93 of the wafer W by the reactive plasma action.

Hereinafter, in case of etching under the above-mentioned processing condition, a selectivity of the silicon nitride film 92 to the silicon oxide film 93 and an etching state of the silicon nitride film 92 are investigated.

Figures 4, 5:
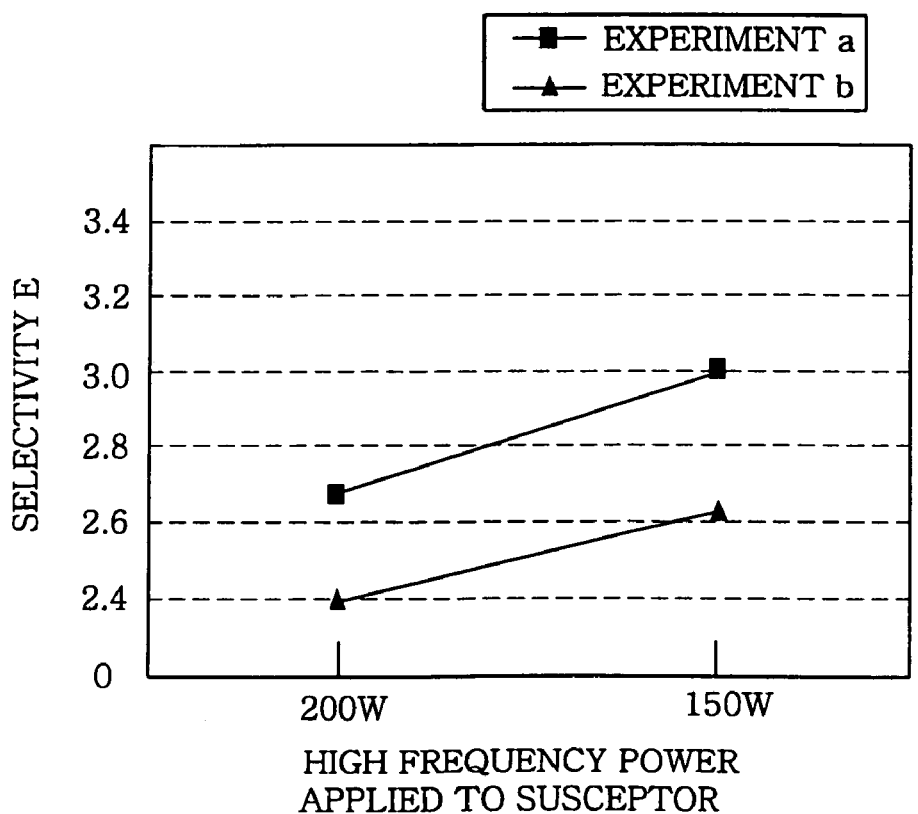
FIG. 4 presents a table showing results of Experiments a and b.
FIG. 5 is a graph showing a change of a selectivity in Experiments a and b.

FIG. 4 shows experimental results showing a selectivity E of the silicon nitride film 92 to the silicon oxide film 93 (an etching rate of the silicon nitride film 92/an etching rate of the silicon oxide film 93) when an etching is performed while the high frequency power applied to the susceptor 13 is chosen to be 200 W (0.20 W/cm$^2$) or 150 W (0.15 W/cm$^2$) in Experiments a and b performed under different processing conditions. Further, FIG. 5 is a graph showing a change of the selectivity E in Experiments a and b.

Experiment a was performed while a high frequency power applied to the upper electrode 30 is fixed to be 2000 W (1.80 W/cm$^2$) and a flow rate of the processing gas is fixed to be $CF_4$ gas/$H_2$ gas/$N_2$ gas=20/450/50 (cm$^3$/min). Experiment b was performed while a high frequency power applied to the upper electrode 30 is fixed to be 2000 W (1.80 W/cm$^2$) and a flow rate of the processing gas is fixed to be $CF_4$ gas/$H_2$ gas/$N_2$ gas=28/900/70 (cm$^3$/min).

From the results of Experiments a and b, it can be shown that the selectivity E increases by reducing the high frequency power applied to the susceptor 13 from 200 W (0.20 W/cm$^2$) to 150 W (0.15 W/cm$^2$). Further, even when the high frequency power applied to the susceptor 13 is 200 W (0.20 W/cm$^2$), the selectivity E is equal to or greater than 2.4. Thus, a high selectivity E equal to or greater than 2.4 can be obtained by maintaining the high frequency power applied to the susceptor 13 equal to or smaller than 200 W (0.20 W/cm$^2$).

Figure 6A:
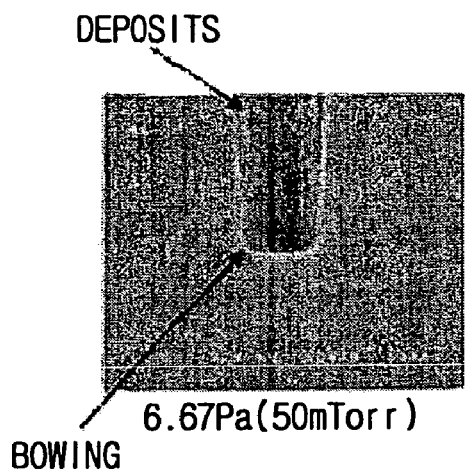
FIGS. 6A to 6C represent photographs showing etching states observed by varying a pressure in the processing chamber.
Figure 6B:
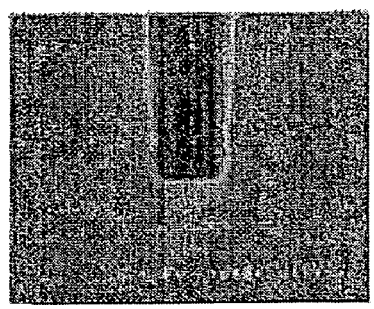
Figure 6C:
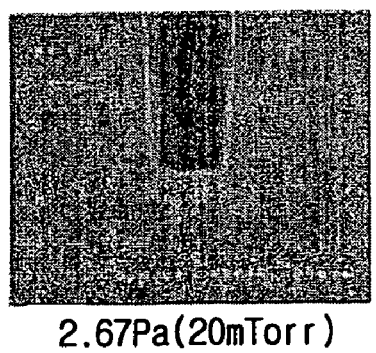

FIGS. 6A to 6C present photographs showing etching states of the silicon nitride film 92 by varying the pressure in the processing space S in etching.

As shown in FIGS. 6A to 6C, when the pressure in the processing space S is 6.67 Pa (50 mTorr), it is possible to observe the deposits of reaction products accumulating in the groove of the silicon nitride film 92 and, also, bowing occurring at the bottom portion of the groove. When the pressure in the processing space S is 4.0 Pa (30 mTorr), the deposits in the groove of the silicon nitride film 92 and bowing at the bottom portion of the groove are hardly observed. Further, when the pressure in the processing space S is 2.67 Pa (20 mTorr), both deposits and bowing are not observed.

As described above, when the pressure in the processing space S is made to be equal to or smaller than 4.0 Pa, the deposits and bowing are suppressed and a favorable etching shape can be obtained. Further, if the pressure in the processing space S is depressurized to 2.67 Pa or less, a more favorable etching shape can be achieved.

As described above, the silicon nitride film 92 is selectively etched through the silicon oxide film 93 by employing a gaseous mixture containing $CF_4$ gas, $H_2$ gas and $N_2$ gas as a processing gas while a high frequency power applied to the susceptor 13 is chosen to be equal to or smaller than 200 W (0.20 W/cm$^2$) and the pressure in the processing space S is chosen to be equal to or smaller than 4.0 Pa, whereby it is possible to obtain a high selectivity E and a favorable etching shape. Further, it is preferable that the high frequency power applied to the susceptor 13 and the pressure in the processing space S are respectively equal to or greater than 20 W (0.02 W/cm$^2$) and 0.67 Pa (5 mTorr).

Figures 7, 8:
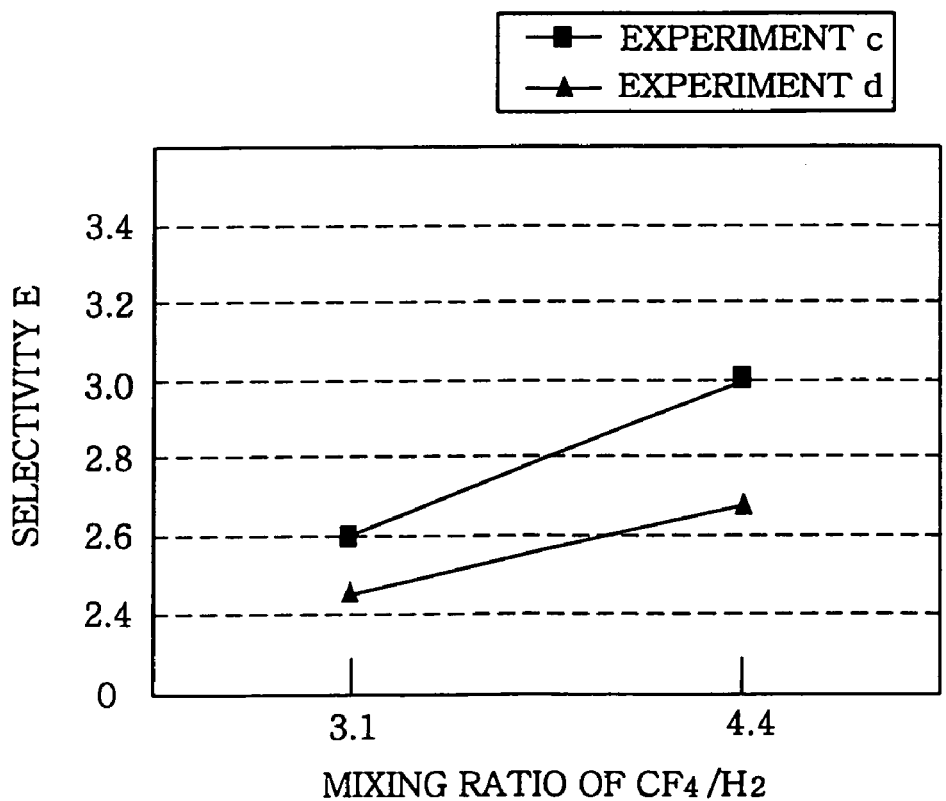
FIG. 7 presents a table showing results of Experiments c and d.
FIG. 8 is a graph showing a change of a selectivity in Experiments c and d.

FIG. 7 shows experimental results showing a selectivity E of the silicon nitride film 92 to the silicon oxide film 93 when an etching is performed while a mixing ratio of $CF_4$ gas to $H_2$ gas in the processing gas is chosen to be 3.1% or 4.4% in Experiments c and d performed under different processing conditions. Further, FIG. 8 is a graph showing a change of the selectivity E in Experiments c and d.

Experiment c was performed while a high frequency power applied to the upper electrode 30 is fixed to be 2000 W (1.80 W/cm$^2$) and a high frequency power applied to the susceptor 13 is fixed to be 200 W (0.20 W/cm$^2$). Experiment d was performed while a high frequency power applied to the upper electrode 30 is fixed to be 2000 W (1.80 W/cm$^2$) and a high frequency power applied to the susceptor 13 is fixed to be 150 W (0.15 W/cm$^2$).

From the results of Experiments c and d, it can be shown that the selectivity E is equal to or greater than 2.4 by making a mixing ratio of CF$_4$ gas to H$_2$ gas to be 3.1% or 4.4%. Further, it shows that the selectivity E tends to increase as a mixing ratio of CF$_4$ gas to H$_2$ gas increases from 3.1% to 4.4%. On the other hand, it is confirmed by the inventor that if a mixing ratio of CF$_4$ gas to H$_2$ gas is raised excessively, an etching rate of the silicon oxide film 93 increases and the selectivity E decreases. Therefore, a high selectivity E equal to or greater than 2.4 can be obtained by maintaining a mixing ratio (volumetric ratio) of CF$_4$ gas to H$_2$ gas to be at least 3.1~4.4%.

Further, in accordance with the preferred embodiment, since an etching is performed by using H$_2$ gas and N$_2$ gas instead of O$_2$ gas and Ar gas used in the conventional technique, an underlying film, which in this case is the nickel silicide film 91, does not change in quality or does not get sputtered by a processing gas. Thus, it is also possible to suppress damage thereto.

Figure 9:
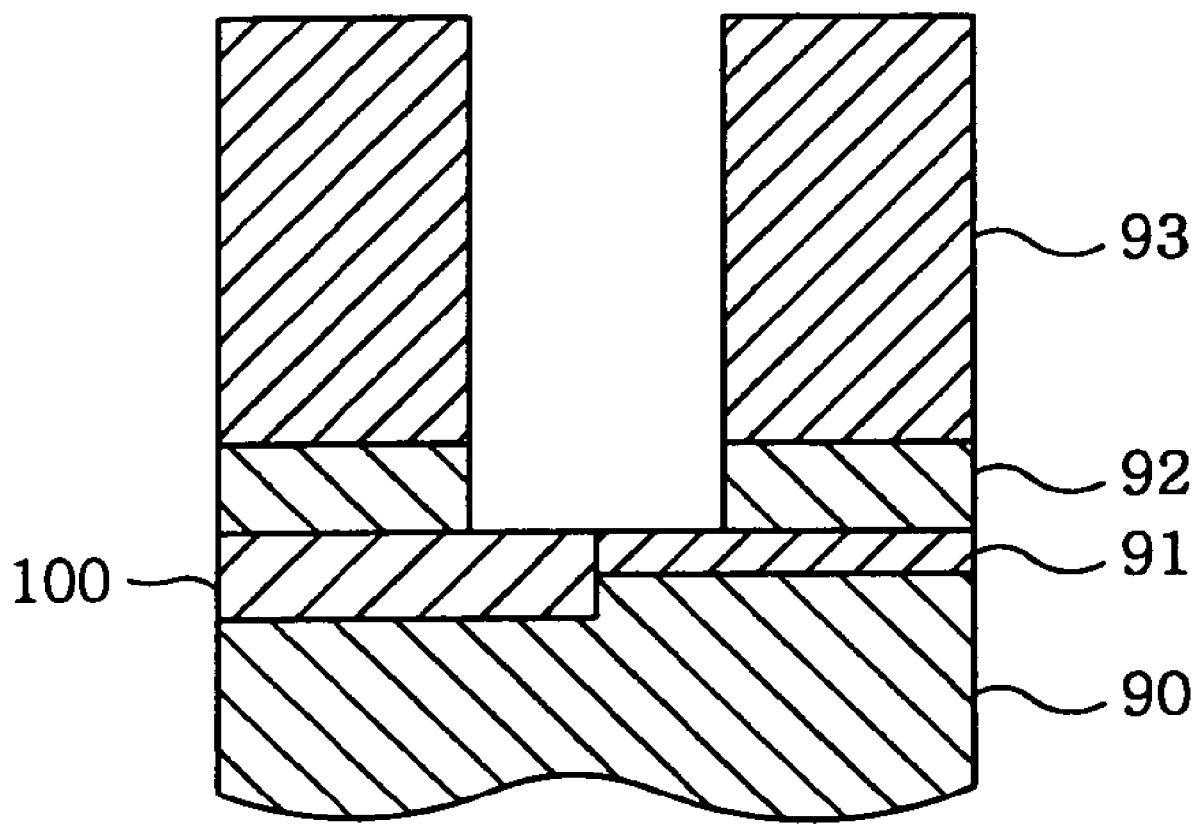
FIG. 9 shows a longitudinal sectional view of the wafer when its underlying film partially includes a silicon oxide film.

In accordance with the preferred embodiment, since a selectivity of the silicon nitride film to the silicon oxide film is secured in etching, even when the underlying film includes a silicon oxide film 100 and the nickel silicide film 91 as shown in FIG. 9, an etching can be performed to generate a favorable shape. Such a film structure is used, for example, in case of forming a contact hole around a field oxide film formed by LOCOS (Local Oxidation of Silicon) process. Further, the same effect can be obtained even though the underlying film is formed of only a silicon oxide film.

While the invention has been shown and described with respect to the preferred embodiment, it will be understood by those skilled in the art that various changes and modification may be made without departing from the spirit and scope of the invention as defined in the following claims. For example, although the silicon nitride film 92 is etched through a mask of the silicon oxide film 93 in the preferred embodiment, the present invention can be also applied to a different film structure wherein the silicon nitride film is etched to the silicon oxide film. Further, the nickel silicide film is NiSi in the preferred embodiment, but may be Ni$_3$Si, Ni$_5$Si$_2$, Ni$_2$Si, Ni$_3$Si$_2$, NiSi$_2$ and the like. Further, although high frequency powers are respectively applied to the upper electrode 30 and the susceptor 13 in the preferred embodiment, the present invention can be also applied to a case when both a high frequency power for generating a plasma and a high frequency power for generating a bias voltage are applied to the susceptor (lower electrode) 13. Further, the present invention can be also applied to an etching method using an ICP (inductively coupled plasma), wherein a plasma is generated by applying a high frequency power to an antenna instead of the upper electrode 30. Further, the present invention can be also applied to an etching of a target object other than a semiconductor wafer, for example, FPD (flat panel display) or a mask reticle for a photo mask.

What is claimed is:

1. An etching method for selectively etching a silicon nitride film to a silicon oxide film by using a processing gas in a processing chamber including an electrode therein, the method comprising the steps of:
   mounting a target object having the silicon oxide film and the silicon nitride film onto the electrode; and
   etching the silicon nitride film by introducing a gaseous mixture containing CF$_4$ gas, H$_2$ gas and N$_2$ gas as a processing gas into the processing chamber and applying a high frequency power of 0.20 W/cm$^2$ or less to the electrode while maintaining a pressure in the processing chamber to be equal to or smaller than 4 Pa.

2. The etching method of claim 1, wherein the processing gas is introduced into the processing chamber while a volumetric ratio of the CF$_4$ gas to the H$_2$ gas is 3.1~4.4%.

3. The etching method of claim 1, wherein the silicon nitride film is etched by using the silicon oxide film as a mask while an underlying film thereof is a nickel silicide film.

4. The etching method of claim 1, wherein the silicon nitride film is etched by applying a high frequency power to another electrode disposed to face the electrode.

* * * * *